(12) United States Patent
Hauenstein

(10) Patent No.: US 9,054,119 B2
(45) Date of Patent: Jun. 9, 2015

(54) DUAL COMPARTMENT SEMICONDUCTOR PACKAGE

(71) Applicant: International Rectifier Corporation, El Segundo, CA (US)

(72) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 14/162,690

(22) Filed: Jan. 23, 2014

(65) Prior Publication Data

US 2014/0131767 A1 May 15, 2014

Related U.S. Application Data

(63) Continuation of application No. 13/075,597, filed on Mar. 30, 2011, now Pat. No. 8,637,981.

(51) Int. Cl.
| | |
|---|---|
| *H01L 23/34* | (2006.01) |
| *H01L 23/02* | (2006.01) |
| *H01L 23/00* | (2006.01) |
| *H01L 23/492* | (2006.01) |

(Continued)

(52) U.S. Cl.
CPC .............. *H01L 23/564* (2013.01); *H01L 23/34* (2013.01); *H01L 23/492* (2013.01); *H01L 24/29* (2013.01); *H01L 24/32* (2013.01); *H01L 25/072* (2013.01); *H01L 25/18* (2013.01); *H01L 2224/32245* (2013.01); *H01L 2924/1203* (2013.01); *H01L 2924/13055* (2013.01); *H01L 24/06* (2013.01); *H01L 2224/06181* (2013.01); *H01L 2224/2929* (2013.01); *H01L 2224/29339* (2013.01); *H01L 2924/16153* (2013.01); *H01L 29/7393* (2013.01)

(58) Field of Classification Search
CPC ............... H01L 2924/16153; H01L 2924/161; H01L 2924/16151; H01L 2924/16152; H01L 2924/1616; H01L 2924/16196
USPC .................... 257/685, 723, 725, 726, E23.001
See application file for complete search history.

(56) References Cited

U.S. PATENT DOCUMENTS

| | | | | |
|---|---|---|---|---|
| 5,623,394 | A * | 4/1997 | Sherif et al. ................... | 361/705 |
| 6,744,640 | B2 * | 6/2004 | Reis et al. ..................... | 361/818 |

(Continued)

FOREIGN PATENT DOCUMENTS

| | | |
|---|---|---|
| JP | H 9-148492 | 6/1997 |
| JP | 2009-252885 | 10/2009 |
| WO | WO 03/063236 | 7/2003 |

*Primary Examiner* — Ida M Soward
(74) *Attorney, Agent, or Firm* — Farjami & Farjami LLP

(57) ABSTRACT

According to an exemplary embodiment, a dual compartment semiconductor package includes a conductive clip having first and second compartments. The first compartment is electrically and mechanically connected to a top surface of the first die. The second compartment electrically and mechanically connected to a top surface of a second die. The dual compartment semiconductor package also includes a groove formed between the first and second compartments, the groove preventing contact between the first and second dies. The dual compartment package electrically connects the top surface of the first die to the top surface of the second die. The first die can include an insulated-gate bipolar transistor (IGBT) and the second die can include a diode. A temperature sensor can be situated adjacent to, over, or within the groove for measuring a temperature of the dual compartment semiconductor package.

14 Claims, 5 Drawing Sheets

(51) Int. Cl.
*H01L 29/739* (2006.01)
*H01L 25/07* (2006.01)
*H01L 25/18* (2006.01)

(56) References Cited

U.S. PATENT DOCUMENTS

| | | | | |
|---|---|---|---|---|
| 6,943,443 B2 * | 9/2005 | Nobori et al. | | 257/704 |
| 6,979,899 B2 | 12/2005 | Edwards | | |
| 7,250,676 B2 | 7/2007 | Wang | | |
| 7,939,370 B1 * | 5/2011 | Lu et al. | | 438/107 |
| 7,944,046 B2 * | 5/2011 | Chao | | 257/713 |
| 8,138,062 B2 * | 3/2012 | Liu et al. | | 438/455 |
| 8,138,600 B2 | 3/2012 | Muto | | |
| 8,178,956 B2 * | 5/2012 | Do et al. | | 257/676 |
| 8,240,037 B2 * | 8/2012 | Kitamura et al. | | 29/846 |
| 8,268,670 B2 * | 9/2012 | Tashiro et al. | | 438/106 |
| 8,507,316 B2 * | 8/2013 | Chu et al. | | 438/107 |
| 8,586,414 B2 * | 11/2013 | Xue et al. | | 438/112 |
| 8,669,656 B2 | 3/2014 | Slupsky | | |
| 2003/0026077 A1 * | 2/2003 | Wennemuth et al. | | 361/714 |
| 2005/0035444 A1 * | 2/2005 | Huang | | 257/706 |
| 2005/0194673 A1 * | 9/2005 | Kwon et al. | | 257/686 |
| 2006/0191908 A1 | 8/2006 | Park | | |
| 2009/0057884 A1 * | 3/2009 | Too et al. | | 257/723 |
| 2010/0164092 A1 * | 7/2010 | Lu | | 257/702 |
| 2010/0181665 A1 | 7/2010 | Casey | | |
| 2010/0308454 A1 | 12/2010 | Lu | | |
| 2011/0089558 A1 | 4/2011 | Muto | | |
| 2011/0260306 A1 * | 10/2011 | Fan | | 257/676 |
| 2011/0304032 A1 * | 12/2011 | Ramos et al. | | 257/675 |
| 2012/0087095 A1 | 4/2012 | Tokuyama | | |

* cited by examiner

DUAL COMPARTMENT SEMICONDUCTOR PACKAGE

This is a continuation of application Ser. No. 13/075,597 filed Mar. 30, 2011.

BACKGROUND OF THE INVENTION

1. Field of the Invention

The present invention is generally in the field of semiconductors. More particularly, the invention relates to the packaging of semiconductor dies.

2. Background Art

An insulated-gate bipolar transistor (IGBT) can be connected to a freewheeling diode when implementing a power switch in a high power application, such as in a three-phase motor drive. In one approach to connecting the IGBT and the diode, the devices can be included in a common package, or a co-package. For example, a co-package can include the IGBT and the diode on a common substrate in close proximity. However, the IGBT and the diode may move resulting in undesirable contact and reduced reliability. For example, the IGBT and the diode may become very hot, resulting in failure of the contact to the common substrate. In another approach, the IGBT and the diode can be in separate packages to reduce the risk of movement of the IGBT and the diode. However, utilizing separate packages increases distances between the IGBT and the diode, resulting in a higher inductance connection between the devices. Furthermore, bond wires are typically employed as interconnects, resulting in reduced current carrying capability, higher inductance, and higher resistance.

In order to avoid excessive heating, a temperature sensor may monitor the temperature of the IGBT, and a heat sink may dissipate heat from the IGBT and the diode. Where the IGBT has an external temperature sensor, the temperature sensor can be difficult to place in good thermal contact with the IGBT and can also interfere with placement of the heat sink and other components. Thus, an internal temperature sensor is typically included with the IGBT. The internal temperature sensor is monolithically formed with IGBT so that the temperature sensor is in good thermal contact with the IGBT while being unobtrusive to placement of the heat sink another the other components. However, including the internal temperature sensor with the IGBT increases the size of the IGBT and, moreover, accurate measurement of the temperature signal is difficult due to a noisy environment produced by switching the IGBT. Furthermore, the internal temperature sensor requires an extra mask layer during fabrication of the IGBT, thereby increasing manufacturing cost.

Thus, it would be desirable to provide an IGBT with a diode in a higher reliability package, while avoiding the risk of the devices moving; and it would be further desirable to include a temperature sensor that does not interfere with placement of a heat sink and other components.

SUMMARY OF THE INVENTION

A dual compartment semiconductor package with temperature sensor, substantially as shown in and/or described in connection with at least one of the figures, as set forth more completely in the claims.

DETAILED DESCRIPTION OF THE INVENTION

The present invention is directed to a dual compartment semiconductor package with temperature sensor. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
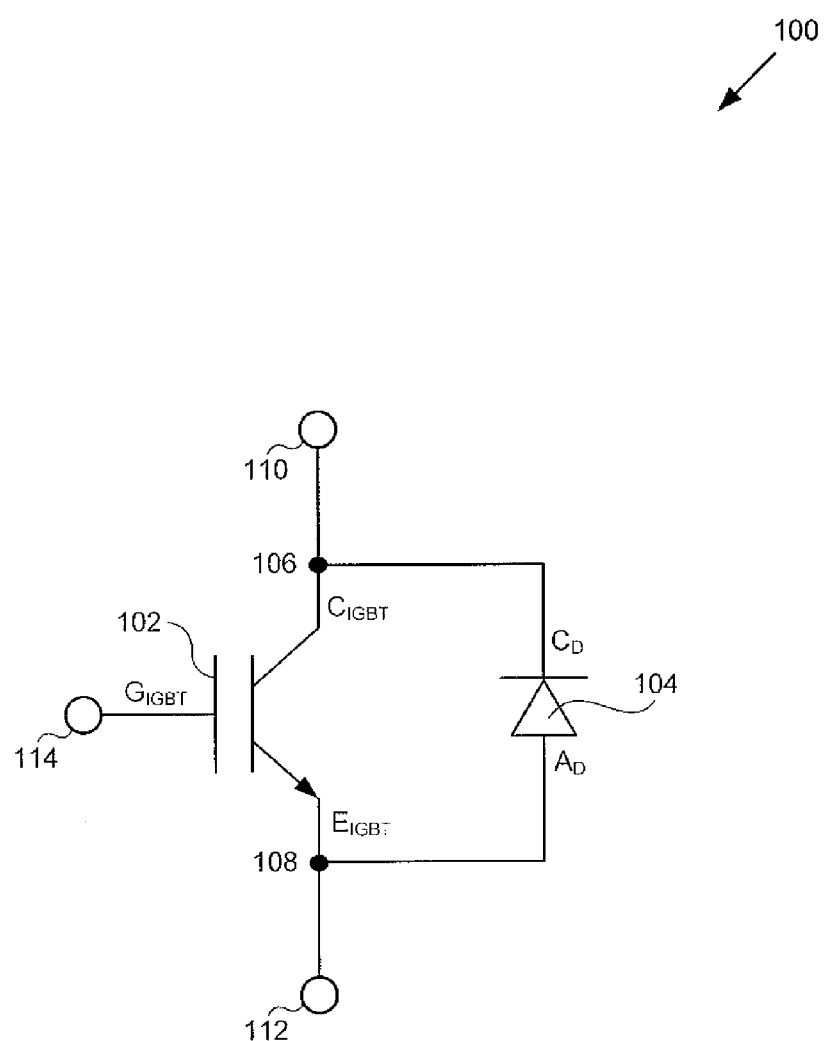
FIG. 1 illustrates an exemplary circuit, which can be implemented using a dual compartment semiconductor package, according to one embodiment of the invention.

FIG. 1 illustrates circuit 100, which can be implemented using a dual compartment semiconductor package, according to one embodiment of the invention. Circuit 100 comprises IGBT 102 and diode 104. As shown in FIG. 1, diode 104 is connected in parallel with IGBT 102. Diode 104 has cathode $C_D$ and anode $A_D$. IGBT 102 has collector $C_{IGBT}$ and emitter $E_{IGBT}$. In circuit 100, cathode $C_D$ of diode 104 is connected to collector $C_{IGBT}$ of IGBT 102 at node 106, which is connected to terminal 110. Also in circuit 100, anode $A_D$ of diode 104 is connected to emitter $E_{IGBT}$ of IGBT 102 at node 108, which is connected to terminal 112. IGBT 102 also has gate $G_{IGBT}$ connected to terminal 114. Circuit 100 shows IGBT 102 and diode 104 being anti-parallel, however, in other embodiments cathode $C_D$ can be connected to emitter $E_{IGBT}$ and anode $A_D$ can be connected to collector $C_{IGBT}$. In one embodiment, IGBT 102 can comprise a power switch and diode 104 can comprise a freewheeling diode. For example, circuit 100 can comprise a high-side, or a low-side power switch in a phase of a three-phase motor drive.

Figure 2:
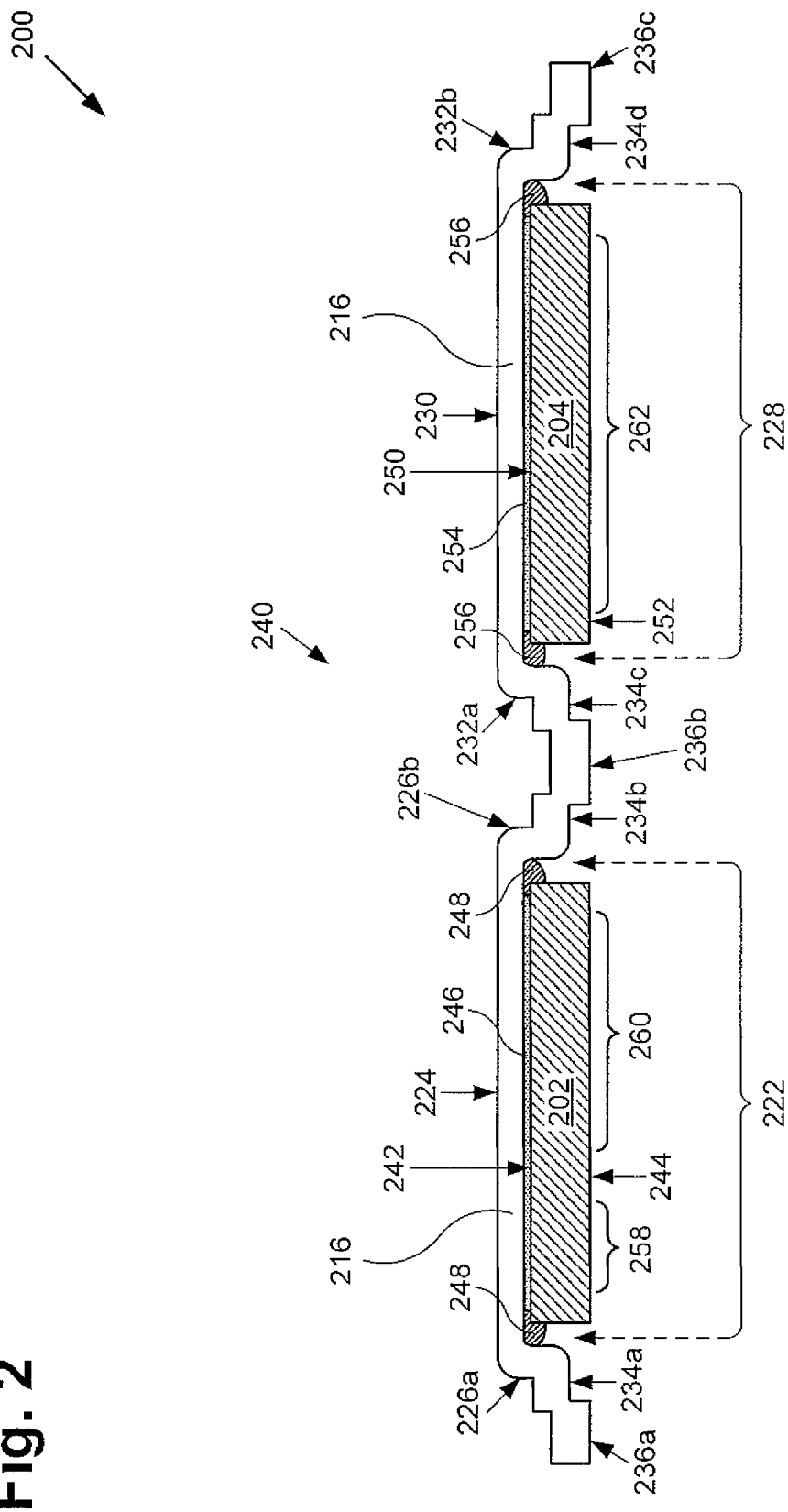
FIG. 2 illustrates a cross section of an exemplary dual compartment semiconductor package, according to one embodiment of the invention.

FIG. 2 illustrates a cross section of package 200, according to one embodiment of the invention. Package 200 is a dual compartment semiconductor package. As shown in FIG. 2, package 200 includes conductive clip 216, IGBT die 202, and diode die 204. In the present embodiment, conductive clip 216 is a metal clip and more particularly a copper clip. Conductive clip 216 has compartments 222 and 228, webs 224 and 230, walls 226a, 226b, 232a, and 232b, extension portions 234a, 234b, 234c, and 234d, contact portions 236a, 236b, and 236c, and groove 240.

IGBT die 202 comprises gate electrode 258 and emitter electrode 260 on bottom surface 244 and connected collector electrode 246 on top surface 242. IGBT die 202 can correspond to IGBT 102 in FIG. 1. Thus, gate electrode 258 can correspond to gate $G_{IGBT}$, emitter electrode 260 can correspond to emitter $E_{IGBT}$ and connected collector electrode 246 can correspond to $C_{IGBT}$ in FIG. 1. In some embodiments IGBT die 202 can comprise a plurality of respective gate, emitter, and collector electrodes. Also, in some embodiments, bottom surface 244 can comprise solderable front metal (SFM).

Diode die 204 comprises anode electrode 262 on bottom surface 252 and connected cathode electrode 254 on top surface 250. Diode die 204 can correspond to diode 104 in FIG. 1. Thus, anode electrode 262 can correspond to anode $A_D$ and connected cathode electrode 254 can correspond to cathode $C_D$ in FIG. 1. In some embodiments IGBT die 202 can comprise a plurality of respective anode and cathode electrodes. Also, in some embodiments, bottom surface 252 can comprise SFM.

Package 200 is electrically connecting respective top surfaces 242 and 250 of IGBT die 202 and diode die 204. More particularly, a collector of IGBT die 202 is electrically connected to compartment 222 through top surface 242 of IGBT die 202 and a cathode of diode die 204 is electrically connected to compartment 228 through top surface 250 of diode die 204.

As shown in FIG. 2, walls 226a and 226b extend down from opposing ends of web 224 to define compartment 222. Compartment 222 is electrically and mechanically connected to top surface 242 of IGBT die 202. As shown in FIG. 2, package 200 includes connected collector electrode 246, which is electrically and mechanically connected to compartment 222 and comprises conductive material such as solder or conductive epoxy, for example silver-loaded epoxy, and die attach material 248 mechanically connecting top surface 242 and compartment 222. In some embodiments, IGBT die 202 can comprise a plurality of connected collector electrodes on top surface 242.

Also shown in FIG. 2, walls 232a and 232b extend down from opposing ends of web 230 to define compartment 228. Compartment 228 is electrically and mechanically connected to top surface 250 of diode die 204. As shown in FIG. 2, package 200 includes connected cathode electrode 254, which is electrically and mechanically connected to compartment 228 and comprises conductive material such as solder or conductive epoxy, for example silver-loaded epoxy, and die attach material 256 mechanically connecting top surface 250 and compartment 228. In the present embodiment, conductive layer 254 is electrically connecting compartment 228 and a cathode of diode die 204. In some embodiments, diode die 204 can comprise a plurality of connected cathode electrodes on top surface 250.

Also in conductive clip 216, contact portions 236a, 236b, and 236c each comprise a generally planar contact surface and can be used to connect package 200 to a substrate. In some embodiments contact portions 236a, 236b, and 236c can each make electrical and mechanical contact with conductive traces on the substrate. In other embodiments, at least one of contact portions 236a, 236b, and 236c, particularly contact portion 236b, may not make electrical and/or mechanical contact with the conductive traces. Also, while contact portions 236a, 236b, and 236c are coplanar in the present embodiment, in some embodiments only contact portions 236a and 236c may be coplanar. For example, contact portion 236b can be disposed above bottom surfaces 244 and 252 and contact portions 236a and 236c. In some embodiments extension portions 234b and 234c and contact portion 236b can be continuous and unitary. Also in the present embodiment, bottom surfaces of contact portions 236a, 236b, and 236c are coplanar with one another and with bottom surfaces 244 and 252 of IGBT die 202 and diode die 204. In some embodiments bottom surfaces 244 and 252 may be disposed above at least one of the bottom surfaces of contact portions 236a, 236b, and 236c.

In the present embodiment, conductive clip 216 includes extension portions 234a, 234b, 234c, and 234d connecting and laterally separating contact portions 236a, 236b, and 236c and walls 226a, 226b, 232a, and 232b. For example, extension portion 234b connects and laterally separates contact portion 236b and wall 226b and extension portion 234c connects and laterally separates contact portion 236b and wall 232a. In some embodiments, package 200 does not include at least one of extension portions 234a, 234b, 234c, and 234d. For example, contact portion 236a can be directly connected to wall 226a, contact portion 236b can be directly connected to walls 226b and 232a, and contact portion 236c can be directly connected to wall 232b. Also in some embodiments contact portions 236a, 236b, and 236c may not be disposed lateral to walls 226a, 226b, and 236c as shown in FIG. 2. Rather, for example, contact portion 236a can be disposed under wall 226a and can be continuous and unitary with wall 226a.

In conductive clip 216, groove 240 is formed between compartments 222 and 228 and can prevent electrical contact between respective bottom surfaces 244 and 252 of IGBT die 202 and diode die 204. As shown in FIG. 2, groove 240 comprises a trench defined by contact portion 236b, extension portions 234b and 234c, wall 226b of compartment 222, and wall 232a of compartment 228. Contact portion 236b is under groove 240. The particular structure of groove 240 shown and described with respect to FIG. 2 is not intended to limit groove 240. For example, in other embodiments groove 240 can be rounded or triangular as specific examples. In some embodiments, groove 240 may not include contact portion 236b and/or extension portions 234b and 234c. In the present embodiment, the top surfaces of webs 224 and 230 are coplanar and groove 240 extends below webs 224 and 230.

By forming groove 240 between compartments 222 and 228, groove 240 can prevent electrical contact between respective bottom surfaces 244 and 252 of IGBT die 202 and diode die 204. For example, groove 240 can maintain separation between IGBT die 202 and diode die 204. Thus, the risk of electrical shorting due to the failure of device interconnects and movement of IGBT die 202 and diode die 204 can be substantially reduced in relation to conventional approaches. Where the IGBT has an external temperature sensor, the temperature sensor can be difficult to place in good thermal contact with the IGBT and can also interfere with placement of the heat sink and other components. By electrically and mechanically connecting compartment 222 to top surface 242 of IGBT die 202 and electrically and mechanically connecting compartment 228 to top surface 250 of diode die 204, IGBT die 202 and diode die 204 can be interconnected without bond wires and with short lead lengths and distances between the devices. Thus, package 200 can have a small footprint, high current carrying capability, low inductance, and low resistance. Also, package 200 allows for convenient placement of an optional external temperature sensor and/or heat sink. Without bone wires, the heat sink can be arranged to have good thermal contact to IGBT die 202 and/or diode die 204 through top surfaces 242 and/or 250.

It is noted that in other embodiments, IGBT die 202 and/or diode die 204 can be electrically and mechanically connected to compartments 222 and 228 in a manner different from the embodiment shown and described with respect to FIG. 2. As an example, in one embodiment anode electrode 262 can be on top surface 250 of diode die 204. Furthermore, while FIG. 2 shows IGBT die 202 and diode die 204, in other embodiments IGBT die 202 and diode die 204 can comprise other electrical components and do not necessarily comprise an IGBT and a diode respectively.

Figure 3:
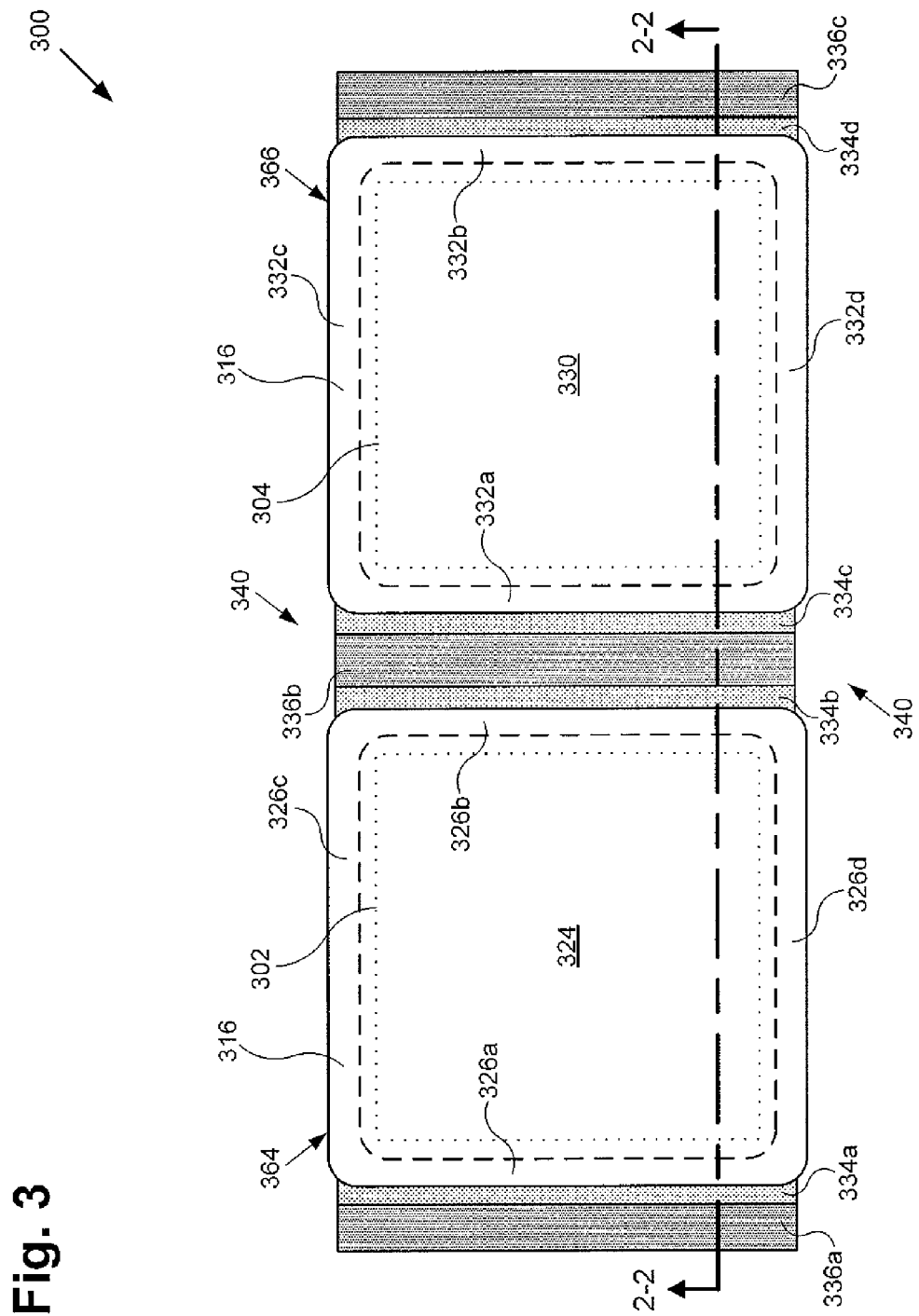
FIG. 3 illustrates a top view of an exemplary dual compartment semiconductor package, according to one embodiment of the invention.

Referring now to FIG. 3, FIG. 3 illustrates a top view of package 300, according to one embodiment of the invention. Cross section 2-2 indicated in FIG. 3 can correspond to the cross section of package 200 shown in FIG. 2. FIG. 3 shows conductive clip 316, webs 324 and 330, walls 326a, 326b, 332a, and 332b, extension portions 334a, 334b, 334c, and 334d, contact portions 336a, 336b, and 336c, IGBT die 302, and diode die 304 corresponding respectively to conductive clip 216, webs 224 and 230, walls 226a, 226b, 232a, and 232b, extension portions 234a, 234b, 234c, and 234d, contact portions 236a, 236b, and 236c, IGBT die 202, and diode die 204 in FIG. 2. In FIG. 3, IGBT die 302 and diode die 304 are disposed under respective webs 324 and 330 and are indicated by respective dotted outlines.

According to one embodiment, package 300 is a dual can semiconductor package including cans 364 and 366. Can 364 includes web 324 and walls 326a, 326b, 326c, and 326d, which extend down from web 324 and surround IGBT die 302. Can 366 includes web 330 and walls 332a, 332b, 332c, and 332d, which extend down from web 330 and surround diode die 304. Dashed lines in FIG. 3 indicate—inner boundaries of walls 226a, 226b, 226c, 226d, 332a, 332b, 332c, and 332d.

As shown in FIG. 3, groove 340 is formed between can 364 and 366. Groove 340 can separate IGBT die 302 and diode die 304. In the present embodiment, groove 340 extends along the length of cans 364 and 366. In some embodiments groove 340 may not be continuous as shown in FIG. 3 and may not completely separate cans 364 and 366. Although FIG. 3 shows cans 364 and 366 as being the same size, cans 364 and 366 can be different sizes with respect to one another. Furthermore, IGBT die 302 and diode die 304 can be different sizes with respect to each other and cans 364 and 366. Also, it is noted that in some embodiments, package 300 does not include walls 326c, 326d, 332c, and 332d, but still may include walls 326a, 326b, 332a, and 332b.

Figure 4:
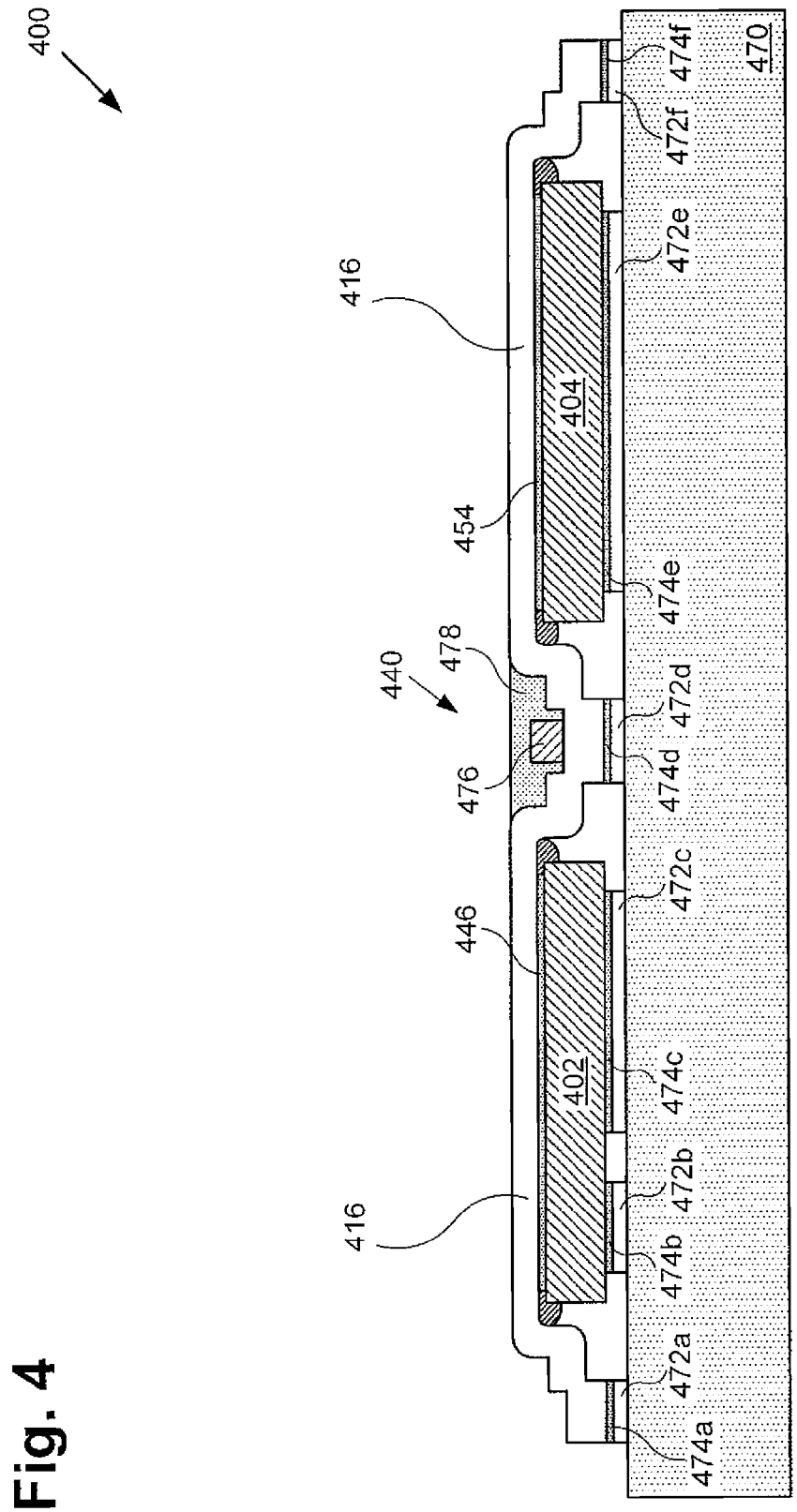
FIG. 4 illustrates a cross section of an exemplary dual compartment semiconductor package mounted on a substrate, according to one embodiment of the invention.

Turning now to FIG. 4, FIG. 4 illustrates a cross section of package 400 mounted on substrate 470, according to one embodiment of the invention. Package 400 can correspond to package 200 mounted on a substrate. FIG. 4 shows IGBT die 402, diode die 404, and conductive clip 416 corresponding respectively to IGBT die 202, diode die 204, and conductive clip 216 in FIG. 2. FIG. 4 also shows substrate 470 having conductive traces 472a, 472b, 472c, 472d, 472e, and 472f (also referred to herein as conductive traces 472a-f) formed thereon. Substrate 470 can comprise, for example, ceramic, aluminum nitride, or other substrate materials. In the present embodiment, conductive traces 472a-f can comprise copper bonded to substrate 470 to form a direct bonded copper (DBC) structure. FIG. 4 shows package 400 mounted to the DBC structure.

FIG. 4 also shows connected contact portions 474a, 474d, and 474f, which correspond to contact portions 236a, 236b, and 236c in FIG. 2 connected to respective conductive traces 472a, 472d, and 472f. Connected contact portions 474a, 474d, and 474f are electrically and mechanically connected to substrate 470 and comprise conductive material such as solder or conductive epoxy, for example silver-loaded epoxy. FIG. 4 also shows connected gate electrode 474b, connected emitter electrode 474c, and connected anode electrode 474e, corresponding to gate electrode 258, emitter electrode 260, and anode electrode 262 in FIG. 2 connected to respective conductive traces 472b, 472c, and 472e. Connected gate electrode 474b, connected emitter electrode 474c, and connected anode electrode 474e are electrically and mechanically connected to substrate 470 and comprise conductive material such as solder or conductive epoxy, for example silver-loaded epoxy. In some embodiments IGBT die 402 and diode die 404 can comprise SFM.

Package 400 enables IGBT die 402 and diode die 404 to be interconnected with short lead lengths and distances between the devices. In the present embodiment, conductive clip 416 corresponds to node 106 in FIG. 1. Conductive traces 472c and 472e are electrically connected, can comprise a single conductive trace on substrate 470, and collectively correspond to node 108 in FIG. 1. Also, conductive trace 472b corresponds to terminal 114 in FIG. 1. Thus, IGBT die 402 and diode die 404 can be interconnected to form circuit 100 in FIG. 1. In the present embodiment, connected contact portion 474d, which is under groove 440, is connected to substrate 470. In FIG. 4, connected contact portion 474d, which is under groove 440, is electrically connected to conductive trace 472d on substrate 470 and is configured as an electrical contact of package 400, which advantageously reduces contact resistance.

IGBT die 402 and diode die 404 may become very hot, for example, during operation as a power switch. As a result, connected gate electrode 474b, connected emitter electrode 474c, and connected anode electrode 474e may fail allowing for IGBT die 402 and diode die 404 to move. However, groove 440 can advantageously maintain separation between IGBT die 402 and diode die 404. Thus, groove 440 can prevent electrical contact between respective bottom surfaces of IGBT die 402 and diode die 404. As such, the risk of electrical shorting due to the failure of device interconnects and movement of IGBT die 402 and diode die 404 can minimized.

As discussed above with respect to FIG. 2, package 200 allows for convenient placement of an optional external temperature sensor. In the present embodiment, package 400 includes temperature sensor 476 that is disposed within groove 440 and below the top surface of package 400 (in some embodiments, temperature sensor 476, can be placed over groove 440 or, in general, adjacent to groove 440). As temperature sensor 476 is in good temperature contact with conductive clip 416, which itself is in good temperature contact with IGBT die 402, temperature sensor 476 can measure a temperature of IGBT die 402. In some embodiments temperature sensor 476 can measure a temperature of diode die 404. Temperature sensor 476 can comprise any suitable temperature sensor, such as a positive temperature coefficient (PTC) thermistor, a negative temperature coefficient (NTC) thermistor, and a chip resistor.

FIG. 4 shows temperature sensor 476 embedded in filler material 478, which can fill groove 440. Filler material 478 can be deposited over temperature sensor 476 and planarized. In some embodiments filler material 478 comprises thermally conductive material. Also in some embodiments filler material 478 comprises electrically conductive material. In some embodiments filler material 478 comprises thermally and/or electrically insulating material.

Thus, as shown in FIG. 4, package 400 includes temperature sensor 476 external to IGBT die 402 configured to monitor a temperature of IGBT die 402. As temperature sensor 476 is external to IGBT die 402, the size and manufacturing cost of IGBT die 402 can be reduced. Additionally, temperature sensor 476 can accurately measure a temperature without substantial interference from a noisy environment produced by switching IGBT die 402. Also, by including groove 440, temperature sensor 476 can be easily placed without increasing the size of package 400 and without interfering with placement of other components. For example, by including temperature sensor 476 within groove 440, an optional heat sink can easily be connected to package 400, which will be described in further detail with respect to FIG. 5.

Figure 5:
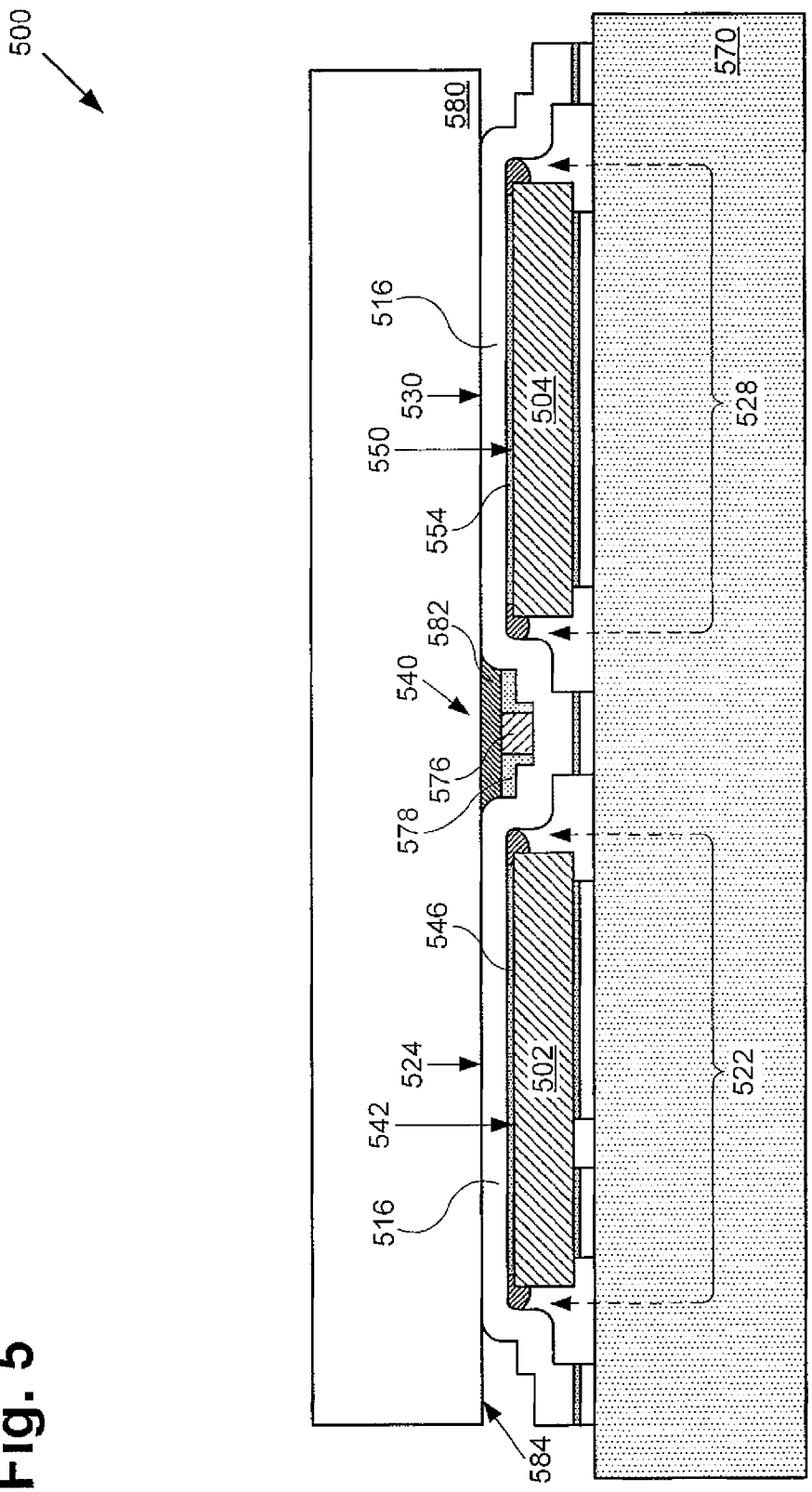
FIG. 5 illustrates a cross section of an exemplary dual compartment semiconductor package mounted on a substrate, according to one embodiment of the invention.

Referring now to FIG. 5, FIG. 5 illustrates a cross section of package 500 mounted on substrate 570, according to one embodiment of the invention. Package 500 can correspond to package 200 in FIG. 2 and package 400 in FIG. 4. FIG. 5 shows IGBT die 502, diode die 504, conductive clip 516, webs 524 and 530, compartments 522 and 528, groove 540, top surfaces 542 and 550, connected collector electrode 546, connected cathode electrode 554, and substrate 570 corresponding respectively to IGBT die 202, diode die 204, conductive clip 216, webs 224 and 230, compartments 222 and 228, groove 240, top surfaces 242 and 250, connected collector electrode 246, connected cathode electrode 254 in FIG. 2. FIG. 5 also shows substrate 570 corresponding to substrate 470 in FIG. 4.

FIG. 5 also shows heat sink 580 situated over groove 540. In the present embodiment, heat sink 580 has bottom surface 584, which is coplanar with top surfaces of webs 524 and 530. Heat sink 580 can comprise any suitable heat sink, and can comprise one or more layers including a metal, a metal alloy, a metal oxide, a metal nitride, a ceramic material, an organic material, and combinations thereof. In one embodiment heat sink 580 comprises a DBC heat sink. Heat sink 580 is thermally connected to compartments 522 and 528 of conductive clip 516. IGBT die 502 and diode die 504 are also thermally connected to compartments 522 and 528 of conductive clip 516. In the present embodiment, connected collector electrode 546 and connected cathode electrode 554 each comprise thermally conductive material which can cover the majority of respective top surfaces 542 and 550. Thus, IGBT die 502 and diode die 504 are in good thermal contact with conductive clip 516 and heat sink 580.

Also in the present embodiment, as IGBT die 502 and temperature senor 576 are each in good thermal contact with conductive clip 516, temperature sensor 576 can measure a temperature of IGBT die 502 while remaining external to IGBT die 502. Furthermore, because temperature sensor 576 is within groove 540, heat sink 580 can easily be connected to package 500. As shown in FIG. 5, heat sink 580 is over temperature sensor 576. FIG. 5 shows filler materials 578 and 582 in groove 540. In the present embodiment filler material 578 is thermally conductive and can be electrically insulative. Thus, thermal contact with conductive clip 516 can be improved. However, filler material 582 is thermally insulative and is configured to thermally insulate temperature sensor 576 and heat sink 580. As such, filler material 582 can improve the accuracy of a temperature measurment of IGBT die 502. In some embodimnets temperature sensor 576 can be thermally and electrically insulated from heat sink 580 by an air pocket (not shown in FIG. 5). Thus, as described above, heat sink 580 can be thermally connected to conductive clip 516 and thermally insulated from temperature sensor 576. It is noted that some embodimnets may include heat sink 580 without temperature sensor 576. However, groove 240 can still optionally include filler material 582 and/or 578.

In the present embodiment, heat sink 580 is not electrically connected to conductive clip 516 and is over webs 524 and 530. Thus, heat sink 580 can protect package 500 from electrical by covering webs 524 and 530, which are electrically conductive. Furthermore, heat sink 580 can provide rigidity to package 500 and can abate heating of package 500 to reduce the risk of interconnect failure.

Thus, as discussed above, in the embodiments of FIGS. 1 through 5, the present invention can provide for a dual compartment semiconductor package for an IGBT and a diode. The dual compartment semiconductor package can include a groove formed between first and second compartments to prevent electrical contact between respective bottom surfaces of the IGBT and the diode by maintaining separation between the IGBT and the diode. As such, the risk of electrical shorting due to failure of device interconnects and movement of the IGBT and the diode can be minimized. Also, the dual compartment semiconductor package can allow for interconnection between the IGBT and the diode without bond wires. An external temperature sensor can optionally be situated over the groove for measuring a temperature of the dual compartment semiconductor package. The external temperature sensor is convinient to place without increasing the size of the dual compartment semiconductor package. Also, an optional heat sink can easily be thermally connected to the IGBT and the diode.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A semiconductor package comprising:
a conductive clip having first and second compartments;
said first compartment electrically connected to a first die;
said second compartment electrically connected to a second die;
a groove formed between said first and second compartments and including a contact portion;
said conductive clip electrically connecting said first to said second die.

2. The semiconductor package of claim 1, wherein said second die comprises a diode.

3. The semiconductor package of claim 1, wherein said first die comprises an insulated-gate bipolar transistor (IGBT).

4. The semiconductor package of claim 3, wherein a collector electrode of said IGBT is situated over said first die and a gate electrode and an emitter electrode of said IGBT are situated under said first die.

5. The semiconductor package of claim 1, wherein said first die comprises an IGBT and said second die comprises a diode.

6. The semiconductor package of claim 5, wherein a collector of said IGBT is connected to said first compartment, and a cathode of said diode is connected to said second compartment.

7. The semiconductor package of claim 1, wherein said contact portion is configured to connect to a substrate.

8. The semiconductor package of claim 1, comprising a heat sink over said groove.

9. The semiconductor package of claim 1, comprising a heat sink thermally connected to said first compartment.

10. The semiconductor package of claim 1, comprising a heat sink thermally connected to said second compartment.

11. The semiconductor package of claim 1, comprising a heat sink thermally connected to said first and second compartments.

12. The semiconductor package of claim 1, wherein a top surface of said first compartment is coplanar with a top surface of said second compartment.

13. A semiconductor package comprising:
a conductive clip having first and second compartments;

said first compartment electrically connected to a first die, said first die comprises an insulated-gate bipolar transistor (IGBT), wherein a collector electrode of said IGBT is situated over said first die and a gate electrode and an emitter electrode of said IGBT are situated under said first die;

said second compartment electrically connected to a second die;

a groove formed between said first and second compartments and including a contact portion;

said package electrically connecting said first to said second die.

14. A semiconductor package comprising:

a conductive clip having first and second compartments;

said first compartment electrically connected to a first die, said first die comprising an insulated-gate bipolar transistor (IGBT), wherein a collector of said IGBT is connected to said first compartment;

said second compartment electrically connected to a second die, said second die comprising a diode, wherein a cathode of said diode is connected to said second compartment;

a groove formed between said first and second compartments and including a contact portion;

said package electrically connecting said first to said second die.

* * * * *